United States Patent
Gross et al.

(10) Patent No.: US 6,756,563 B2
(45) Date of Patent: Jun. 29, 2004

(54) SYSTEM AND METHOD FOR FORMING HOLES IN SUBSTRATES CONTAINING GLASS

(75) Inventors: Abraham Gross, Ramat Aviv (IL); Zvi Kotler, Tel Aviv (IL)

(73) Assignee: Orbotech Ltd., Yavne (IL)

(*) Notice: Subject to any disclaimer, the term of this patent is extended or adjusted under 35 U.S.C. 154(b) by 64 days.

(21) Appl. No.: 10/167,472

(22) Filed: Jun. 13, 2002

(65) Prior Publication Data

US 2003/0168434 A1 Sep. 11, 2003

Related U.S. Application Data

(60) Provisional application No. 60/362,084, filed on Mar. 7, 2002.

(51) Int. Cl.$^7$ ............................................. B23K 26/14
(52) U.S. Cl. .................................................. 219/121.7
(58) Field of Search ........................ 219/121.7, 121.61, 219/121.62, 121.67, 121.68, 121.69, 121.71, 121.72

(56) References Cited

U.S. PATENT DOCUMENTS

| | | | | |
|---|---|---|---|---|
| 5,191,466 A | * | 3/1993 | Gross et al. ................. | 359/305 |
| 5,593,606 A | * | 1/1997 | Owen et al. ............ | 219/121.71 |
| 5,761,227 A |  | 6/1998 | Hargis et al. .................. | 372/22 |
| 6,185,231 B1 |  | 2/2001 | Hammons et al. ............ | 372/20 |
| 6,407,363 B2 | * | 6/2002 | Dunsky et al. ......... | 219/121.71 |
| 6,470,712 B2 | * | 10/2002 | Koyama et al. ............... | 65/392 |
| 6,491,361 B1 | * | 12/2002 | Spann ............................ | 347/2 |
| 6,534,743 B2 | * | 3/2003 | Swenson et al. ........ | 219/121.69 |

OTHER PUBLICATIONS

Article: Jerry Martyniuk, "UV Laser—assisted wire stripping and micro–machining", SPIE vol. 2062, pp. 30–38, Jun. 1, 1995.

Theresa J. Alexander et al., "High–energy Q–switched 0.945–$\mu$m solid–state diode pumped laser", J. Opt Soc Am. B, vol. 19, No. 7, Jul. 2000, pp. 1535–1538.

T. Y. Fan and R. L. Byer, "Modeling and CW Operation of a Quasi–Three–Level 946 nm Nd:YAG Laser" IEEE J. Quant. Electron. QE–23, 605 (May 1987).

Hollemann, E Peik and H Walther, "Frequency–stabilized diode–pumped Nd:YAG laser at 946 nm with harmonics at 473 and 237 nm", Optics Letters. vol. 19, No. 3, Feb. 1, 1994.

M. Pierrou, H. Karlsson and F. Laurell, Blue–Light Generation By Frequency Doubling of CW Neodymium Lasers, http://www.optics.kth.se/fysik2/RIO97/PDF/BLUELAS.PDF, no date available.

M. Pierrou and F Laurell, Efficient blue–light generation through intra–cavity frequency doubling of CW Nd:YAG and Nd:YLF lasers, submitted for presentation at CLEO'98.

* cited by examiner

Primary Examiner—Tom Dunn
Assistant Examiner—Jonathan Johnson
(74) Attorney, Agent, or Firm—Sughrue Mion, PLLC

(57) ABSTRACT

A system and method for micromachining substrates containing glass employing a UV laser beam generated by outputting a sub-1000 nm pulsed laser beam that is frequency converted by third harmonic generation to have a wavelength within the range of 285 nm to 333 nm.

12 Claims, 4 Drawing Sheets

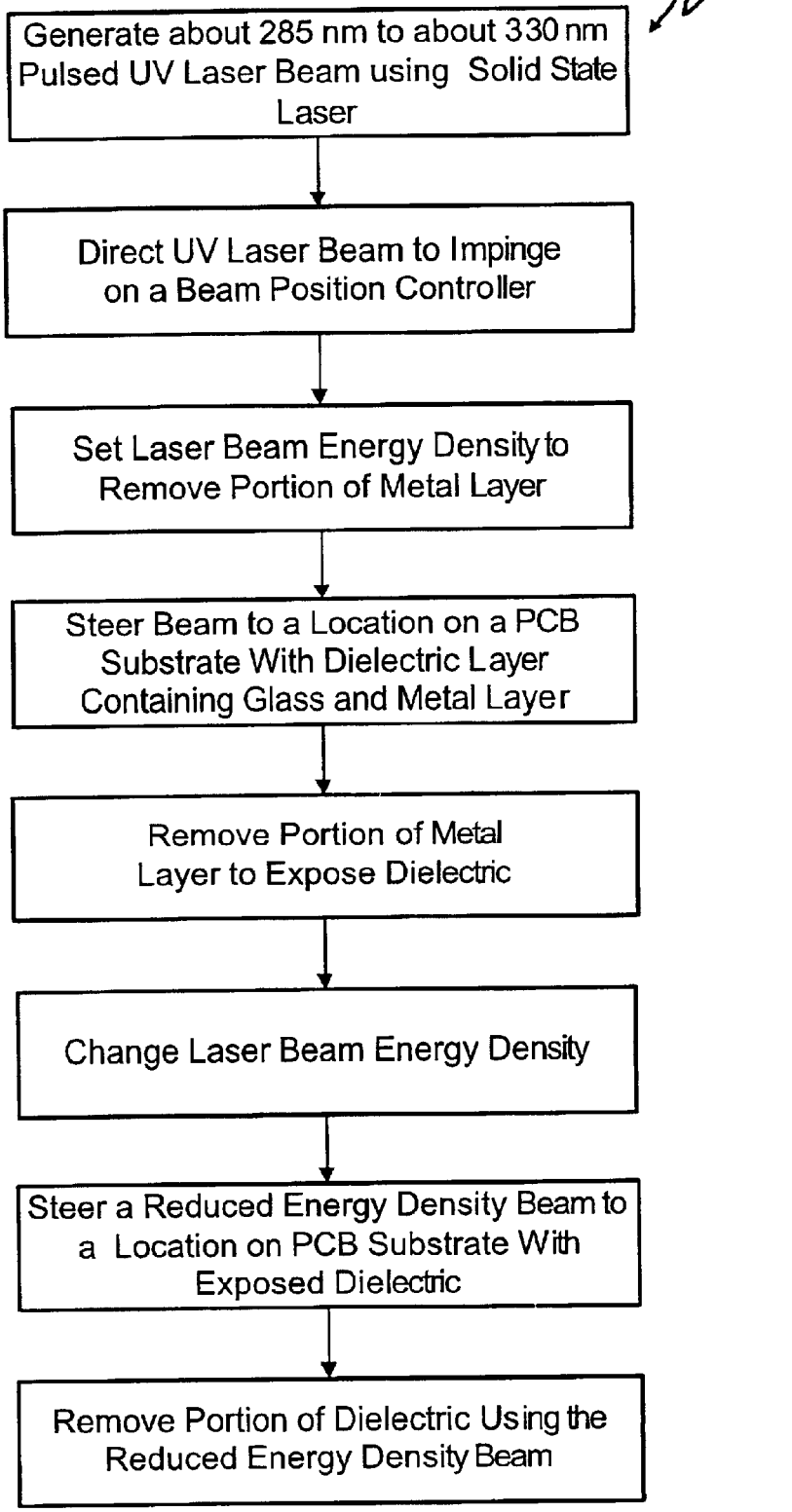

SYSTEM AND METHOD FOR FORMING HOLES IN SUBSTRATES CONTAINING GLASS

CROSS REFERENCE TO RELATED APPLICATION

This application claims the benefit of U.S. Provisional Patent Application No. 60/362,084, filed Mar. 7, 2002, the disclosure of which is incorporated by reference in its entirety.

FIELD OF THE INVENTION

The present invention generally relates to systems and methods for micromachining holes in glass and in objects containing glass. An application for which the present invention is particularly suited is the formation of vias and micro vias in glass reinforced dielectric substrates such as those used in printed circuit boards, ball grid array substrates and similar electrical circuits.

BACKGROUND OF THE INVENTION

It is known to use lasers to micromachine holes such as vias, micro vias, and blind micro vias, in electrical circuits such as printed circuit boards and interconnect chip packages.

Lasers that are suitable for such applications include lasers generating UV laser beams. A conventional method for generating UV laser beams is to pass a pulsed laser beam output from a Q-switched solid state laser, such as Nd:YAG laser, through one or more non-linear crystals. This methodology, called harmonic generation, results in a frequency modified beam. Conventional neodymium based solid state lasers produce laser beams having a wavelength of about 1064 nm. Third harmonic generation of such a beam results in a beam having a wavelength of about 355 nm. Fourth harmonic generation of such a beam results in a beam having a wavelength of about 266 nm.

Beams having a wavelength in the vicinity of 355 nm can efficiently form holes in copper layers of electrical circuit substrates. However, such beams fail to efficiently form holes in glass reinforced dielectric layers of electrical circuit substrates. Beams having a wavelength in the vicinity of 266 nm can efficiently form holes in both copper layers and glass reinforced dielectric layers of electrical circuit substrates. The use of 266 nm beams however is problematic, for example, due to the loss of power resulting from the fourth harmonic generation process, optical requirements of lenses used with such beams, reduced damage thresholds of optical elements and relatively high cost.

SUMMARY OF INVENTION

The present invention seeks to provide improved systems and methods for forming holes in glass substrates and other substrates containing glass, such as printed circuit board substrates.

A broad aspect of the invention relates to a laser device for outputting UV laser light having a wavelength in the range of about 285 nm to about 333 nm, and more specifically between about 290 nm and 320 nm.

Another broad aspect of the invention relates to a micromachining system for forming holes in substrates containing glass, in which a frequency converted pulsed UV laser beam having a wavelength in the range of 285 nm–333 nm, and more specifically between about 290 nm–about 320 nm is employed.

Another broad aspect of the invention relates to a micromachining system for forming holes in substrates containing glass in which a sub-1000 nm beam output by a pulsed solid state laser, converted into a UV beam, is employed.

Another broad aspect of the invention relates to systems and methods for fabricating electrical circuits, such as printed circuit boards, containing glass. Electrical circuit fabrication includes depositing a layer of a metallic conductor material on a surface of a dielectric substrate containing glass, forming a hole in the layer of metallic conductor material with a UV laser beam in the range of about 285 nm to about 333 nm, and more specifically between about 290 nm and 320 nm, and then at a location of a hole in the layer metallic conductor, forming a hole in the layer of dielectric substrate containing glass with a UV laser beam in the range of about 285 nm–about 333 nm, and more specifically between about 290 nm and 320 nm.

In accordance with an embodiment of the invention, a UV laser beam having a wavelength in the range of between about 285 nm and about 333 nm, and more specifically between about 290 nm and 320 nm is obtained by outputting a sub-1000 nm laser beam from a solid state laser, such as by a neodymium doped or ytterbium doped laser crystal, and then frequency converting the sub-1000 nm laser beam by means of third harmonic generation to produce a laser beam having a wavelength in the range of about 285 nm to about 333 nm, and more specifically between about 290 nm and 320 nm.

In accordance with an embodiment of the invention, a suitable UV laser beam in the range of about 285 nm to about 333 nm, and more specifically between about 290 nm and 320 nm, is obtained by harmonic generation of an initial sub-1000 nm laser beam. In an embodiment of the invention, a sub-1000 nm laser beam is the product of laser transitions in the range of 870 nm and 980 nm. Such laser transitions are produced, for example, by the laser excitation of neodymium ions or ytterbium ions in suitably doped YAG, YLF, $YVO_4$ and $YAlO_3$ crystals. In an embodiment of the invention, harmonic generation is third harmonic generation resulting from the passing of the sub-1000 nm laser beam through at least one non-linear, or other suitable frequency converting, optical medium.

BRIEF DESCRIPTION OF DRAWINGS

The present invention will be understood and appreciated more fully from the following detailed description, taken in conjunction with the drawings in which:

FIG. 4 is a flow diagram of a method for manufacturing electrical circuits in accordance with an embodiment of the invention.

DETAILED DESCRIPTION

Figure 1:
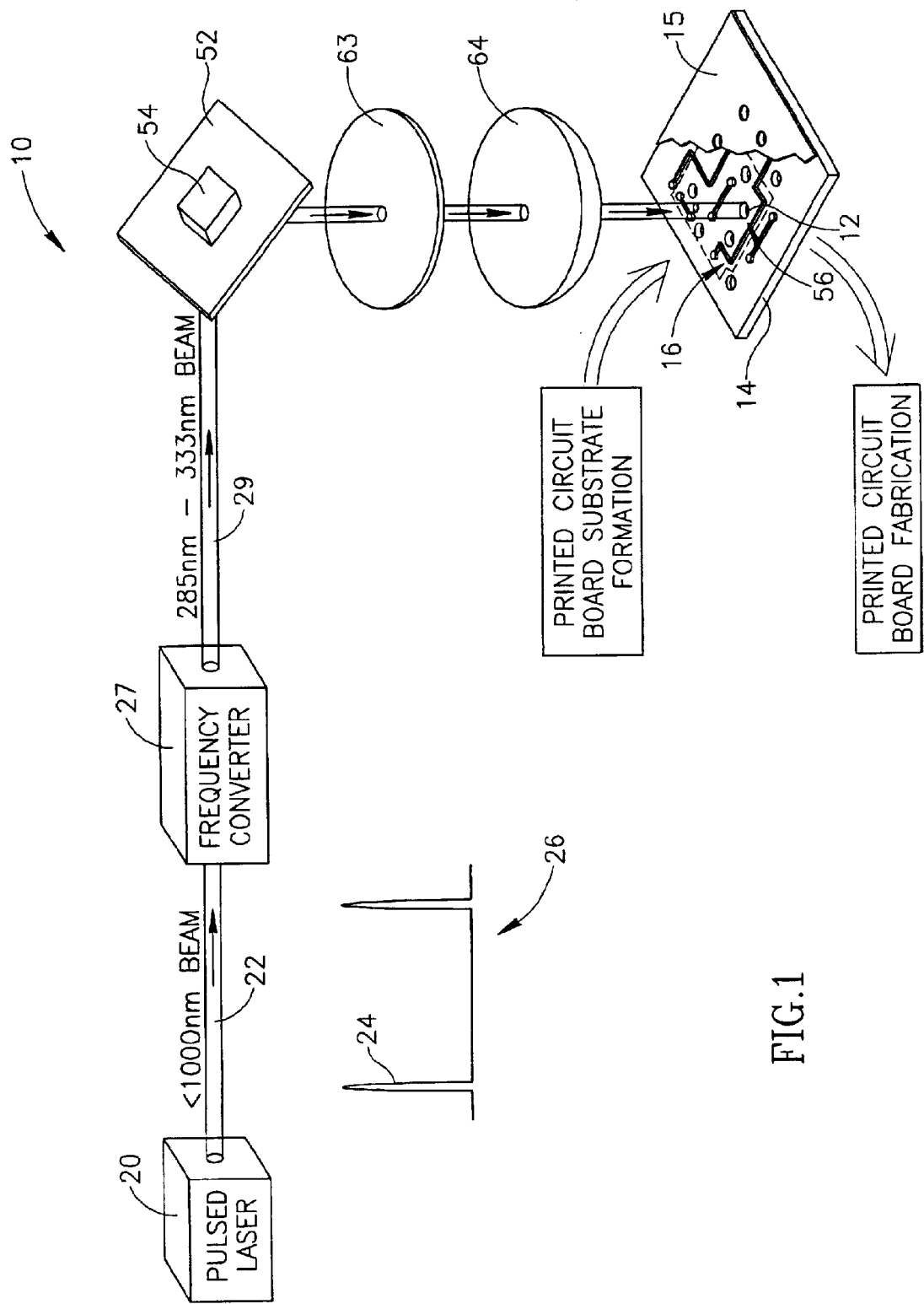
FIG. 1 is a simplified illustration of a system and functionality for fabricating an electrical circuit constructed and operative in accordance with the present invention.

Reference is made to FIG. 1, which is a simplified pictorial illustration of a system and functionality for fabricating an electrical circuit in accordance with the present invention and including laser machining apparatus 10. Laser machining apparatus 10 is particularly useful in the context of removing material to form holes, such as vias 12, in printed circuit board substrates 14 which may be produced using conventional printed circuit board fabrication systems and techniques. Laser machining apparatus 10 may also be useful in the formation of other types of holes on printed circuit boards, for example, blind vias and through holes. Moreover, laser machining apparatus 10 may be used for performing machining and ablating operations on various suitable substrates. Apparatus 10 is particularly suited for micromachining operations on substrates containing glass.

A printed circuit board substrate 14 typically includes one or more dielectric substrate layers. The dielectric substrate layers typically include glass, for example in the form of glass fibers, for mechanical strength and stability. As is known in the art of electrical circuit manufacture, a conductor pattern 16 is formed on the printed circuit board substrate 14. Printed circuit board substrates 14 may include only a single substrate layer, or several substrate layers adhered together.

Instead of a conductor pattern 16 formed on the outer layer of substrate 14, as seen in FIG. 1, a metal foil substantially overlaying a continuous portion of the outer surface of the substrate 14, as seen at the region indicated by reference numeral 15, may be disposed on substrate 14.

In the embodiment seen in FIG. 1, apparatus 10 includes a pulsed laser 20, preferably a diode pumped solid state laser, outputting a pulsed laser beam 22 which is defined by a stream of light pulses, schematically indicated by peaks 24 in laser pulse graph 26. Pulsed laser beam 22 is output by pulsed laser 20 with a principle spectral composition of less than 1000 nm, characteristically associated, for example, with various laser transitions of $Nd^{3+}$ ions in neodymium based solid state lasers such as Nd:YAG, Nd:YLF, Nd:YVO$_4$ and Nd:YAlO$_3$ type lasers. Laser transitions associated with other ions, such as ytterbium, may also provide suitable sub-1000 nm laser outputs.

Pulsed laser beam 22 is passed through a laser frequency converter 27 operative to modify the frequency of pulsed laser beam 22 and to output a frequency modified beam 29 having a principal spectral composition in the UV portion of the electromagnetic spectrum. In the embodiment seen in FIG. 1, laser frequency conversion is the product of third harmonic generation resulting from passing pulsed laser beam through at least two suitable non-linear optical crystals, contained in frequency converter 27, as known in the art of UV laser beam generation. Suitable non-linear optical media include, without limitation, b-BaB$_2$O$_4$ (BBO), LiB$_3$O$_5$ (LBO), KNbO$_3$, KTiOP$_4$ (KTP), periodically poled KTiOPO$_4$ (PPKTP), LiTaO$_3$ and LiIO$_3$ crystals, or any other suitable non-linear optical medium as known in the art. The result of such third harmonic generation of a sub-1000 nm pulsed laser beam 22 is a frequency modified beam 29 having a principal spectral composition, or peak frequency, that is in the range of about 285 nm–about 333 nm, and more specifically between about 296 nm and about 316 nm for typical sub-1000 nm laser transitions associated with neodymium based solid state lasers.

It is appreciated that there are numerous examples of methodologies for modifying the frequency of laser beams, including, for example, Raman conversion and optical parametric oscillation. Harmonic generation in general, and third harmonic generation in particular, are merely examples of suitable methods for frequency modification, and any other suitable method for modifying the frequency of a laser beam may be used in laser frequency converter 27.

As seen in FIG. 1, the frequency modified beam 29 impinges on a selectably positionable deflector 52 located downstream of laser frequency converter 27. The position of deflector 52 is steered by a controllable positioner 54 operative to position deflector 52 in a desired orientation relative to frequency modified beam 29 and printed circuit board substrate 14 such that the frequency modified beam 29 laser beam impinges on a surface of the printed circuit board substrate 14 at a location 56 which is selected from among a plurality of possible selectable locations. It is noted that frequency modified beam 29 may be passed through various optics, such as lenses 63 and 64.

It is a feature of the present invention that by generating a high energy laser beam having a wavelength in the range of 285 nm–333 nm, portions of printed circuit board substrate 14 can be efficiently removed, for example by ablation. Moreover, with a beam having a principal spectral composition in the range of 285 nm–333 nm, such removal is efficient for various types of materials prevalent in conventional printed circuit boards. These materials include glass and other materials employed in conventionally fabricated dielectric layers as well as copper and other conductive materials from which conductors are formed. Thus, by using a beam having a principal spectral composition in the range of about 285 nm–about 333 nm, the various materials forming a conventional printed circuit board substrate 14, including both glass components in its dielectric layer and copper, can be efficiently removed, e.g. by ablation.

It is noted that a sub-330 nm frequency laser beam ablates glass with relative efficiency compared to a 355 nm beam resulting from the third harmonic generation of a 1064 nm beam output by readily available conventional Nd:YAG solid state lasers. It is further noted that sub-330 laser beams, resulting from the frequency conversion of a sub-1000 nm laser transition of Nd ions, inherently have a reduced power output compared to 355 nm laser beams, produced from frequency conversion of the widely used and comparatively efficient 1064 nm laser transition of Nd ions. The inventors believe, however, that for the purposes of micromachining glass and substrates containing glass such as printed circuit board substrates, the comparatively higher ablation efficiency of a sub-333 nm laser beam, generated from a sub-1000 nm initial input beam, in ablating glass at least partially compensates for the reduced power of such a beam compared to the power of a 355 nm laser beam.

In accordance with an embodiment of the present invention, pulsed laser 20 is a diode pumped solid state laser configured to lase using one of the following laser transitions of Nd3+ ions: Nd:YAG—946 nm; Nd:YVO4-914 nm; and Nd:YAlO$_3$— 930 nm. Solid state lasers configured to lase using suitable sub-1000 nm transitions of other ions, such as ytterbium, or lasers employing other suitable laser crystals, such as YLF, may be employed. The pulsed laser 20 preferably is configured to output pulsed laser beam 22 in a Q-switched mode of operation, as is know in the art.

The use of solid state lasers to output sub-1000 nm laser beams is known. For example, such solid state lasers presently are used to produce green and blue laser beams. The architecture of such suitable solid state lasers employing sub-1000 nm laser beams is generally described inter alia at: U.S. Pat. No. 6,185,231, U.S. Pat. No. 5,761,227, T. Y. Fan and R. L. Byer, "Modeling and CW Operation of a Quasi-Three-Level 946 nm Nd:YAG Laser", IEEE J. Quant. Electron. QE-23, 605 (May 1987); Hollemann, E. Peik and H. Walther, Optics Letters, 19, 192 (1994); F. Hanson, Optics Letters, 20, 148 (1995) and M. Pierrou, H. Karlsson and F. Laurell, Blue-Light Generation By Frequency Doubling of CW Neodymium Lasers, http://www.optics.kth.se/fysik2/ RIO97/PDF/BLUELAS.PDF, the disclosures of which are incorporated by reference.

When a pulsed laser beam 22, generated by such a sub-1000 nm pulsed laser 20, is frequency converted, for example by third harmonic generation, in accordance with an embodiment of the invention, the frequency converted beams having peak frequencies as follows are generated: Nd:YAG—~315 nm; Nd:Nd:YVO$_4$—~305 nm; and Nd:YAlO$_3$—~310 nm. It is appreciated that sub-1000 nm laser transitions of other Nd based laser cores, such as for example YLF, or of other non-neodymium solid state, such as for example ytterbium, and non solid state lasers, can be used in combination with suitable second or third harmonic generation, or any other suitable frequency conversion, to generate a UV beam in the range of about 285 nm–about 333 nm.

Suitable non-linear media for harmonic generation of a sub-1000 nm laser beam to produce a frequency modified beam 29 having a wavelength in the range of 285 nm–333 nm, include, for example, the following readily available crystals: b-BaB$_2$O$_4$ (BBO), LiB$_3$O$_5$ (LBO), KNbO$_3$, KTiOPO$_4$ (KTP), periodically poled KTiOPO$_4$ (PPKTP), CsLiB$_6$O$_{10}$, LiTaO$_3$ and LiIO$_3$ crystals. It is appreciated by persons skilled in the art that the crystals need to be suitably matched and arranged for the desired harmonic generation.

Figure 2:
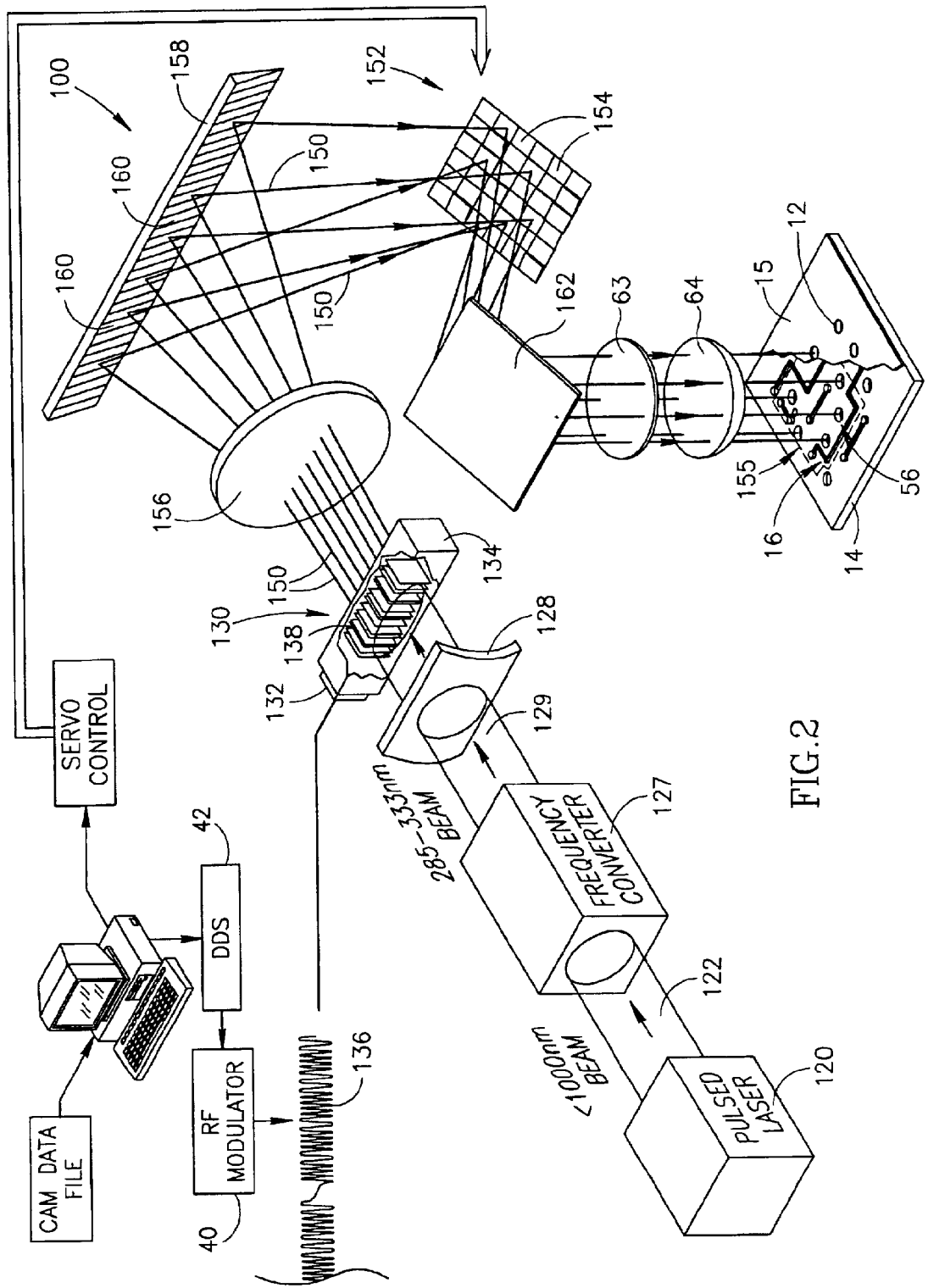
FIG. 2 is a simplified pictorial illustration of a laser micro-machining system constructed and operative in accordance with a preferred embodiment of the present invention.

Reference is now made to FIG. 2 which is a simplified pictorial illustration of a laser micro-machining system 100 constructive and operative in accordance with a preferred embodiment of the invention. Additional aspects and features of the preferred embodiment of the structure and functionality of the multi-beam laser micromachining system 100 are described with reference to FIG. 1A in copending U.S. patent application Ser. No. 10/170,212 entitled "Multiple Beam Micro-Machining System and Method", filed concurrently herewith, corresponding to U.S. provisional patent application Ser. No. 60/297,453, and assigned to Orbotech Ltd. of Israel, the disclosure of which is incorporated herein by reference in its entirety. System 100 differs, however, from the system described in the above noted patent application, in that system 100 employs a pulsed laser 120 outputting a sub-1000 nm pulsed laser beam 122 that is frequency modified by a frequency converter 127 to produce a frequency modified beam 129.

In the embodiment seen in FIG. 2, frequency modified beam 129 impinges on a first lens 128, which is a cylindrical lens operative to flatten the frequency modified beam 129 at an image plane (not seen) in a first variable deflector assembly, such as an acousto-optical deflector (AOD) 130. AOD 130 includes a transducer element 132 and a translucent crystal member 134 formed of Quartz or other suitable crystalline material. A preferred embodiment of the structure and functionality of AOD 130 is described in provisional U.S. patent application Ser. No. 60/387,911, entitled "Dynamic, Multi-Pass, Acousto-Optic Beam Splitter and Deflector", filed concurrently herewith.

Transducer element 132 receives a control signal 136 and generates an acoustic wave 138, shown as a succession of planar waves, that propagates through crystal member 134 of AOD 130. Control signal 136 is, for example, an RF signal provided by an RF modulator 140 that is driven, for example, by a direct digital synthesizer (DDS) 142, or other suitable signal generator. An example of another suitable control signal generator is a voltage controlled oscillator (VCO).

As known in the art, the presence of an acoustic wave 138 in crystal member 134 when frequency modified beam 129 impinges thereon causes the frequency modified beam 129 to be deflected at an angle $\theta_n$ which is a function of the frequency $f_0$ of wave 138 according to the formula:

$$\theta_n = \frac{\Delta f_n \times \lambda}{v_s}$$

Where:

$\Delta f_n = f_n - f_0$ $\lambda$=wavelength of beam 129 and
$v_s$=speed of sound in the crystal of AOD 130.

In an embodiment of the invention, control signal 136 may be provided selectively so as to cause acoustic wave 138 to propagate uniformly through crystal member 134, or alternatively so as to cause acoustic wave 138 to propagate at different frequencies at various spatial segments along the length of the crystal member 134. Thus when acoustic wave 138 is non-uniformly propagated through crystal member 134, frequency modified beam 129 is segmented into several beam segments 150, each of which is deflected at an angle $\theta_n$ which is a function of an acoustic wave frequency of acoustic wave 138 at a localized region in crystal member 134 at the instant a light pulse defining frequency modified beam 129 impinges thereon.

In an embodiment of the invention, the fluence, or energy density, of beam segments 150 is adapted to suit a desired micro-machining operation. For example, ablation of copper or other conductor material typically requires a significantly higher fluence than the fluence required for the ablation of a dielectric substrate.

The fluence of each beam segment 150 is functionally related to the spatial portion of frequency modified beam 129 from which it is formed, and the beam diameter. Thus, segmenting frequency modified beam 129 into several beam segments 150 to produce a beam having a given diameter reduces the fluence of each beam segment 150 compared to an entire beam having the same given diameter; as the total number of beam segments increases, the respective fluence of each beam segment 150 becomes reduced for beam segments all having the same diameter. By controlling the number of beam segments 150 formed from an input beam, for example by propagating a non-uniform acoustic wave 138 through AOD 130, the fluence of each beam segment 150 can be controlled. Moreover, the fluence of any given beam segment 150 may be the same as, or different from, the fluence of other beam segments 150. Such uniformity, or non-uniformity, is controllable by modifying the wave shape of acoustic wave 138 propagating through AOD 130 so that a beam segment is formed from a lesser or greater spatial portion of frequency modified beam 129.

Each one of beam segments 150, whether a single segment provided by a uniform acoustic wave 138 in crystal member 134, or several segments as seen in FIG. 1, are directed to a first predetermined target located at a second variable deflector assembly 152 formed of a plurality of independently tiltable reflector elements 154 each being operative to further separately deflect a beam segment 150 to a target region 155 at a portion of printed circuit board substrate 14 to be micro-machined or drilled.

In accordance with an embodiment of the invention, second variable deflector assembly 152 comprises an optical MEMs device. Alternatively, second variable deflector assembly 152 is formed as an array of steerable reflectors each of which is associated with one or more suitable piezo-electric motors. Still alternatively, second variable deflector assembly 152 is formed as an array of galvanometers, or comprises any other suitable array of independently steerable reflector devices.

In the configuration of an embodiment of the invention seen in FIG. 1, second variable deflector assembly 152 includes a 6×6 array of independently tiltable reflector elements 154.

It is appreciated that the angles $\theta_n$ at which beam segments 150 are deflected relative to the optical axis of an incoming frequency modified beam 129 at AOD 30 typically are very small, in the order of $10^{-2}$ radians. Thus in an embodiment of the invention, in order to provide for a more compact system, a beam angle expander, such as a telescoping optical element, schematically represented by lens 156, operative to increase the mutual angular divergence of beam segments 150, is provided downstream of AOD 130. It is noted that in order to aid in the understanding of the invention, the respective angles of divergence of beam segments 150 are shown in FIG. 2 as being significantly larger than their respective actual angles of divergence.

In the embodiment seen in FIG. 2, AOD 130 is operative to selectably deflect beam segments 150 to a selectable point along an axis lying in a plane. Thus, as seen in FIG. 2, a linear to 2-dimensional mapping assembly 158 is interposed between AOD 130 and second variable deflector assembly 152. In the embodiment seen in FIG. 2, mapping assembly 158 comprises a plurality of mapped sections 160 which are placed in suitable spatial orientation so that each beam segment 150 output by AOD 130 and impinging on a given mapped section 160 is reflected to a conjugate independently tiltable reflector element 154, to which it is mapped, in the second variable deflector assembly 152.

As further seen in FIG. 2, a folding mirror 162, a focusing lens 163 and a telecentric imaging lens 164 are interposed between second variable deflector assembly 152 and printed circuit board substrate 14. It is appreciated that as a function of system geometry and engineering design, a single folding mirror 162, no folding mirror 162 or multiple folding mirrors 162 may be provided. Additionally, it is appreciated that focusing lens 163 and telecentric lens 164 may be combined into a single optical element, or alternatively each of the focusing lens 162 and telecentric lens 164 respectively may comprise multiple lens elements.

Additional and other aspects and features of a preferred embodiment of system 100 are described in Applicants' copending patent application Ser. No. 10/170,212 entitled: "Multiple Beam Micro-Machining System and Method".

Figure 3:
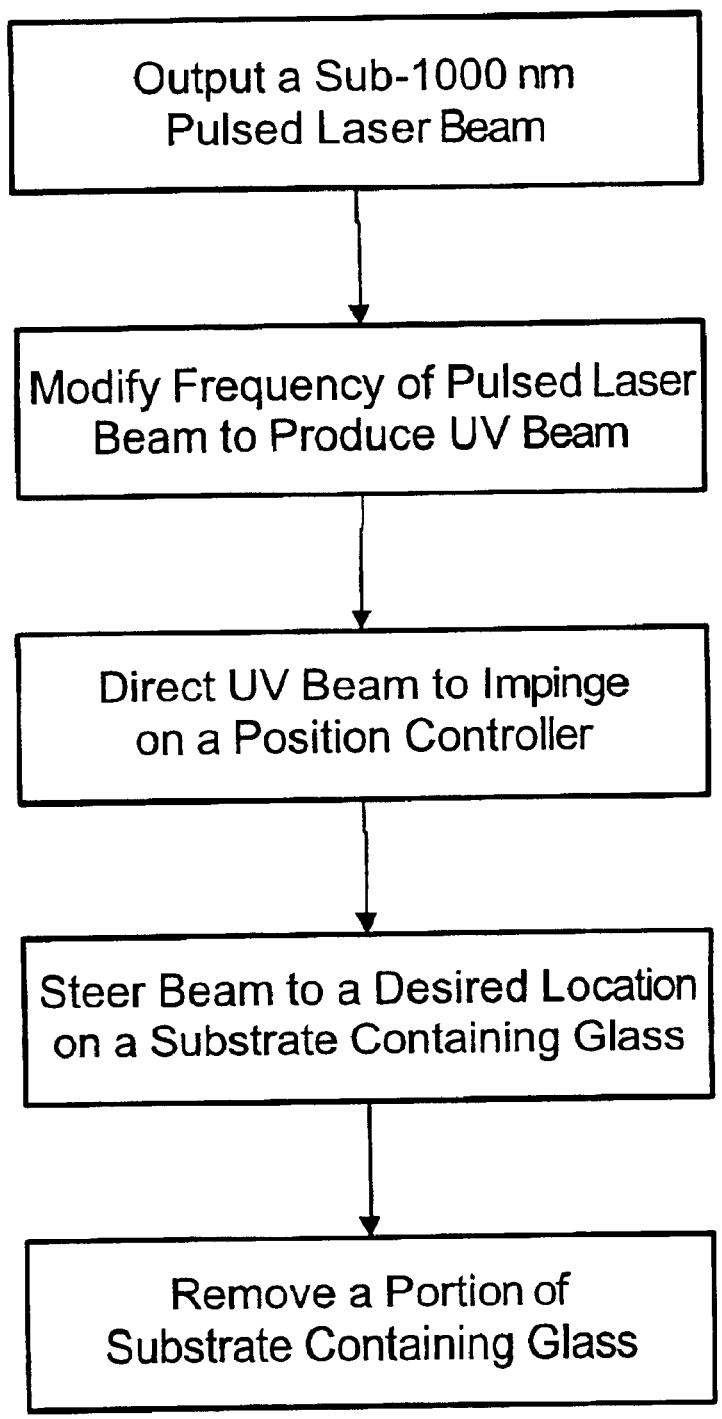
FIG. 3 is a flow diagram of a method for ablating substrates containing glass in accordance with an embodiment of the invention.

Reference is now made to FIG. 3 which is a flow diagram of a method 200 for forming holes in substrates containing glass in accordance with an embodiment of the invention. Method 200 commences with providing a sub-1000 nm pulsed laser beam, for example with a diode pumped solid state pulsed laser, such as pulsed laser 20 in FIG. 1, or pulsed laser 120 in FIG. 2.

The frequency (wavelength) of the pulsed laser beam is converted, for example with a laser frequency converter, such as laser frequency converter 27 in FIG. 1 or laser frequency converter 127 in FIG. 2, to generate a pulsed laser beam having a principal spectral composition in the UV portion of the electromagnetic spectrum. Frequency conversion is, for example, third harmonic generation as described hereinabove, resulting in a beam having a principal spectral line in the range of about 285 nm to about 333 nm, and more specifically between about 290 nm and about 320 nm, and even more specifically between about 304 nm and about 316 nm.

In accordance with method 200, the UV beam is directed to impinge on a laser beam position controller, whose position is chosen so as to steer the UV beam to impinge at a desired location on a substrate containing glass, in order to remove a portion of the substrate containing glass, for example by burning or by ablation.

Reference is now made to FIG. 4 which is a flow diagram of a method 300 for manufacturing electrical circuits in accordance with an embodiment of the invention. Method 300 is employed, for example to form vias, micro vias or through holes in PCB substrates that include a dielectric substrate containing glass which is initially clad with a metal foil. Conductors are formed in later stages of the PCB fabrication process from the metal foil.

As seen in FIG. 4, a pulsed near UV laser beam is generated, for example using a solid state laser, having a principal spectral line in the range of between about 285 nm to about 333 nm, and more specifically between about 290 nm and about 320 nm, and even more specifically between about 304 nm and about 316 nm. As previously described, a suitable UV pulsed laser beam may be generated, for example, with a diode pumped solid state pulsed laser, such as pulsed laser 20 in FIG. 1, or pulsed laser 120 in FIG. 2, outputting a sub-1000 nm laser beam and then frequency converting the laser beam, for example by third harmonic generation.

In accordance with method 300, the near UV beam is directed to impinge on a beam position controller, whose position is chosen so as to steer the UV beam to impinge at a desired location on a PCB substrate having a dielectric layer containing glass and a metal layer, for example copper, covering the dielectric layer.

Fluence, or energy density, of a micromachining beam is controlled, for example by segmenting an initial beam into a suitable plurality of spatially divided portions having a controlled cross section, or by any other suitable means such as controlling the beam pulse repetition rate, to adapt physical characteristics of the beam so that it is suitable to remove a portion of the metal layer covering the dielectric. Application of the beam to the metal layer thus removes a portion of the metal layer, for example by ablation or burning.

Subsequently fluence, or energy density, of the beam is changed, for example by segmenting the beam into a plurality of sub-beams while holding the diameter of the sub-beams constant, irrespective of the number of sub-beams. The beam output after change of fluence is directed to impinge on a beam position controller which steers the beam to a location on the PCB substrate at which a portion of the metal layer was previously removed. Application of the beam having a changed fluence thus removes a portion of the dielectric layer, for example by ablation or burning, it being realized that the energy density required to remove a portion of a dielectric substrate generally is considerably less than the energy density required to remove a portion of metal foil. It is appreciated that, for example in system 100 (FIG. 2) segmentation of the beam into several sub beams in conjunction with an array of independently tiltable deflectors enables removal of a portion of the dielectric layer at several locations simultaneously.

Additional stages in the fabrication of a PCB, not shown in FIG. 4, typically include: applying a photoresist layer to the PCB substrate; exposing the photoresist layer to generate a desired electrical circuit pattern; developing the photoresist; etching the metal layer to remove portions of the metal layer not covered by the photoresist; stripping the photoresist; inspecting the electrical circuit pattern formed on the PCB substrate; and, as required, laminating several PCB substrates together to form an unpopulated PCB.

It is appreciated by persons skilled in the art that the present invention is not limited by what has been particularly shown and described hereinabove. Rather the present invention includes modifications and variations thereof which would occur to a person of skill in the art upon reading the foregoing description and which are not in the prior art.

What is claimed is:

1. A system for forming holes in electrical circuit substrates, comprising:
   a laser outputting a laser beam whose peak frequency is less than 1000 nm;
   a laser beam frequency converter receiving said laser beam and outputting a frequency modified beam whose peak frequency is less than 350 nm; and
   a laser beam position controller receiving said frequency modified beam and directing said frequency modified beam to impinge on a location on a surface of an electrical circuit substrate to remove a portion of said electrical circuit substrate thereat.

2. The system claimed in claim 1 and wherein said laser beam frequency converter outputs a frequency modified beam whose peak frequency is less than 333 nm.

3. The system claimed in claim 1 and wherein said laser outputting a laser beam whose peak frequency is less than 1000 nm is a Q-switched laser.

4. The system claimed in claim 3 and wherein said laser beam whose peak frequency is less than 1000 nm is a pulsed laser beam.

5. The system claimed in claim 1 and wherein said laser is a diode pumped solid state laser.

6. The system claimed in claim 5 and wherein said diode pumped solid state laser is selected from the group consisting of:Nd:YAG; Nd:YLF, Nd:YVO$_4$ and Nd:YAlO$_3$.

7. The system claimed in claim 1 and wherein said frequency converter is a non-linear crystal configured and arranged such that said frequency modified beam is a third harmonic generation of said laser beam whose peak frequency is less than 1000 nm.

8. The system claimed in claim 1 and wherein said laser beam converter comprises at least one non-linear crystal selected from the group consisting of: BBO, LBO, KNbO3 and PPKTP.

9. The system claimed in claim 1 and wherein said laser beam position controller comprises at least one steerable mirror.

10. The system claimed in claim 9 and wherein said at least one steerable mirror comprises an array of independently steerable mirrors.

11. The system claimed in claim 10 and wherein said beam position controller comprises an acousto-optical deflector and a linear array of selectable fixed mirrors optically interposed between said laser and said array of independently steerable mirrors, wherein each fixed mirror in said array of selectable fixed mirrors is arranged to direct a beam impinging thereon to a corresponding independently steerable mirror in said array of independently steerable mirrors.

12. The system claimed in claim 1 and wherein said laser beam position controller directs said frequency modified beam to ablate glass at said location.

* * * * *